United States Patent
Oddoart et al.

(10) Patent No.: US 8,362,833 B2
(45) Date of Patent: Jan. 29, 2013

(54) AMPLIFIER CIRCUITRY, INTEGRATED CIRCUIT AND COMMUNICATION UNIT

(75) Inventors: Ludovic Oddoart, Frouzins (FR); Berengere Le Men, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/131,039

(22) PCT Filed: Jan. 5, 2009

(86) PCT No.: PCT/IB2009/051969
§ 371 (c)(1),
(2), (4) Date: May 25, 2011

(87) PCT Pub. No.: WO2010/076672
PCT Pub. Date: Jul. 8, 2010

(65) Prior Publication Data
US 2011/0248779 A1 Oct. 13, 2011

(51) Int. Cl.
*H03F 3/38* (2006.01)
(52) U.S. Cl. ........ 330/10; 330/306; 330/207 A; 330/251
(58) Field of Classification Search .................... 330/10, 330/207 A, 251, 306; 455/126
See application file for complete search history.

(56) References Cited

U.S. PATENT DOCUMENTS

| | | | |
|---|---|---|---|
| 6,175,273 B1 * | 1/2001 | Sigmon et al. | 330/10 |
| 6,583,664 B2 * | 6/2003 | Mathe et al. | 330/10 |
| 6,727,832 B1 | 4/2004 | Melanson | |
| 6,794,931 B2 * | 9/2004 | Kenington | 330/10 |
| 6,924,757 B2 | 8/2005 | Adams et al. | |
| 6,998,914 B2 * | 2/2006 | Robinson | 330/124 R |
| 7,099,635 B2 * | 8/2006 | McCune | 455/110 |
| 7,183,957 B1 | 2/2007 | Melanson | |
| 7,755,422 B2 * | 7/2010 | Schell et al. | 330/10 |
| 7,965,140 B2 * | 6/2011 | Takahashi | 330/136 |
| 2008/0238543 A1 | 10/2008 | Koch | |

FOREIGN PATENT DOCUMENTS

GB 2435559 A 8/2007

OTHER PUBLICATIONS

Doorn T S; Van Tuijl E; Schinkel D; Annema A J; Berkhout M; Nauta B Ed—Maxim A; Antrik D: "An Audio FIR-DAC in a BCD Process for High Power Class-D Amplifiers" Solid-State Circuits Conference, 2005, ESSCIRC 2005, Proceedings of the 31st European, 20050912-20050916 IEEE, Piscataway, NJ, USA, Sep. 12, 2005, pp. 459-462.
International Search Report and Written Opinion correlating to PCT/IB2009/051969 dated Oct. 8, 2009.

* cited by examiner

*Primary Examiner* — Patricia Nguyen

(57) ABSTRACT

Amplifier circuitry comprising a class-D amplifier for amplifying an audio input signal. The amplifier circuitry comprises sigma-delta modulation logic arranged to receive the audio input signal and to generate a modulated signal representative of the audio input signal, and an output stage arranged to generate an output signal for the amplifier circuitry. The amplifier circuitry further comprises finite impulse response, filter logic operably coupled between the modulation logic and the output stage, and having at least one zero in its transfer function arranged to substantially pass signal components within the modulated signal occurring at frequencies less than the at least one zero and to attenuate signal components within the modulated signal at frequencies greater than the at least one zero.

16 Claims, 4 Drawing Sheets

AMPLIFIER CIRCUITRY, INTEGRATED CIRCUIT AND COMMUNICATION UNIT

FIELD OF THE INVENTION

The field of this invention relates to amplifier circuitry, and in particular to amplifier circuitry for amplifying an audio input signal and an integrated circuit and communication unit comprising said amplifier circuitry.

BACKGROUND OF THE INVENTION

In the field of audio enabled devices, for example wireless communication devices such as mobile telephone handsets, an audio output typically requires a low impedance speaker and a performance audio amplifier. In the context of a wireless communication device, these elements are selected to achieve high power efficiency in order to minimise power consumption, and thereby improve battery life. Class-D amplifiers, which use switching modes of transistors to regulate power delivery, are good candidates, and thus are typically used for such audio applications.

FIG. 1 illustrates an example of a conventional Sigma-Delta based class-D amplifier 100. The amplifier 100 comprises PDM (Pulse Density Modulation) Sigma-Delta modulator circuitry 110, operably coupled to a low distortion power driver 120, which in turn is operably coupled to a speaker 130. Such a conventional amplifier arrangement comprises good total harmonic distortion and noise (THD+N) characteristics, a good power supply rejection ratio (PSSR), and good immunity to electromagnetic interference (EMI).

FIG. 2 illustrates a graphical example 200 of the output power spectrum against frequency for the amplifier 100 of FIG. 1. As can be seen, at lower audio frequencies, the impedance 210 of speaker 130 is low. Accordingly, the majority of the power spectrum at these frequencies comprises the active power (audio signal). However, the speaker 130, due to its inductance model, naturally performs low-pass filtering of the received signal in the analogue domain and removes part of the quantization noise and signal image. Accordingly, at higher frequencies, the impedance of the speaker 130 increases. In particular, at frequencies corresponding to the shaped quantization noise and signal image, the impedance of the speaker 130 is significant, resulting in significant power attenuation at these higher frequencies.

The power efficiency of amplifier 100 may be defined as:

$$\text{Efficiency} = \frac{\frac{Vout_{audio}^2}{Zspk_{audio}}}{\frac{Vout_{audio}^2}{Zspk_{audio}} + \frac{Vout_{HF}^2}{Zspk_{HF}} + \left(\frac{Vout_{audio}}{Zspk_{audio}}\right)^2 \cdot Ron + Vbat^2 \cdot C_{par} \cdot f_s + Vaudio \cdot Icc}$$

where:

$$\frac{Vout_{audio}^2}{Zspk_{audio}}$$

represents the active power (audio signal);

$$\frac{Vout_{HF}^2}{Zspk_{HF}}$$

represents the high frequency (HF) power attenuation (sigma-delta modulation and signal image);

$$\left(\frac{Vout_{audio}}{Zspk_{audio}}\right)^2.$$

represents the conductive power loss (ON resistance of power stage);

$Vbat^2 \cdot C_{par} \cdot f$ represents the switching power loss; and $Vaudio \cdot Icc$ represents the bias power loss (class-D internal consumption).

The higher frequency power attenuation is particularly significant for low level input signals, where the quantization noise becomes proportionately large. Consequently, the power efficiency of the conventional amplifier circuitry 100 of FIG. 1 for low level input signals is dependent, to a large extent, on the speaker impedance at these higher frequencies. Accordingly, the speaker impedance characteristics are a considerable contributor to power efficiency loss of the amplifier circuitry 100, and as such the power efficiency loss can vary from speaker to speaker. The kind of audio architecture illustrated in FIG. 1 may require an external LC filter to improve the power efficiency during low level input signals. Consequently, the choice of speakers that might be suitable for use within an audio enabled device using such a conventional amplifier is limited by the impedance of the speakers, irrespective of any other beneficial or desirable features that the speakers may have.

SUMMARY OF THE INVENTION

The present invention provides amplifier circuitry, a semiconductor device and a communication unit as described in the accompanying claims.

Specific examples of the invention are set forth in the dependent claims.

These and other aspects of the invention will be apparent from and elucidated with reference to the examples described hereinafter.

BRIEF DESCRIPTION OF THE DRAWINGS

Further details, aspects and examples of the invention will be described, by way of example only, with reference to the drawings. Elements in the figures are illustrated for simplicity and clarity and have not necessarily been drawn to scale.

DETAILED DESCRIPTION

Figure 1:
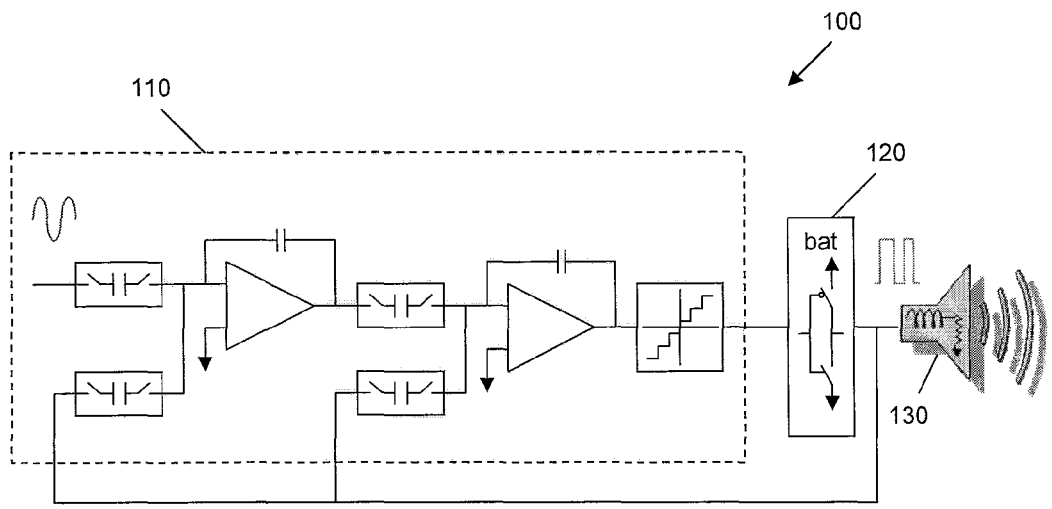
FIG. 1 illustrates an example of a conventional Sigma-Delta based class-D amplifier.
Figure 2:
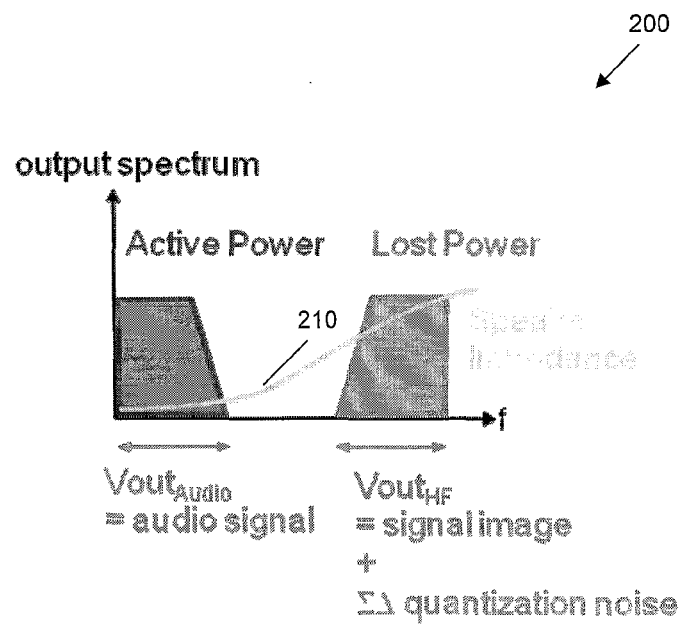
FIG. 2 illustrates an example of the output power spectrum against frequency for the amplifier of FIG. 1.
Figure 3:
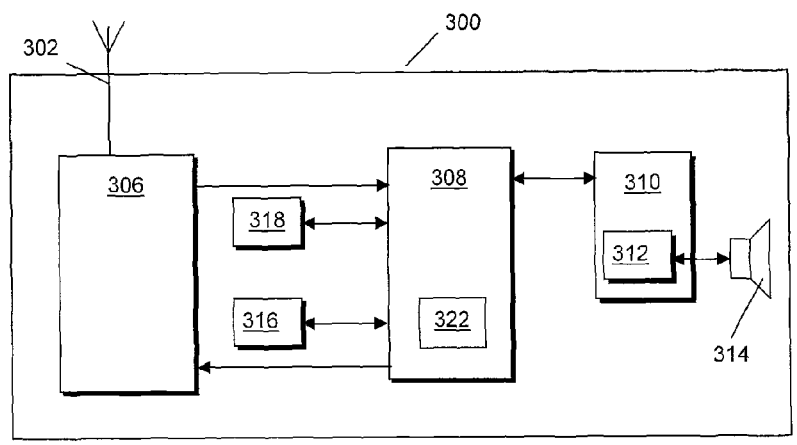
FIG. 3 illustrates an example of a block diagram of part of a communication unit.

Referring first to FIG. 3, there is illustrated an example of a block diagram of part of a communication unit 300. The communication unit 300, in the context of this example, is a mobile telephone handset comprising an antenna 302. As such, the communication unit 300 contains a variety of well known radio frequency components or circuits 306, operably coupled to the antenna 302 that will not be described further herein. The communication unit 300 further comprises signal processing logic 308. An output from the signal processing logic 308 is provided to a suitable user interface (UI) 310 comprising, for example, a display, keypad, etc. In particular for the illustrated example, the user interface 310 comprises amplifier circuitry 312 operably coupled to a speaker 314.

For completeness, the signal processing logic 308 is coupled to a memory element 316 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 318 is typically coupled to the signal processing logic 308 to control the timing of operations within the communication unit 300.

Figure 4:
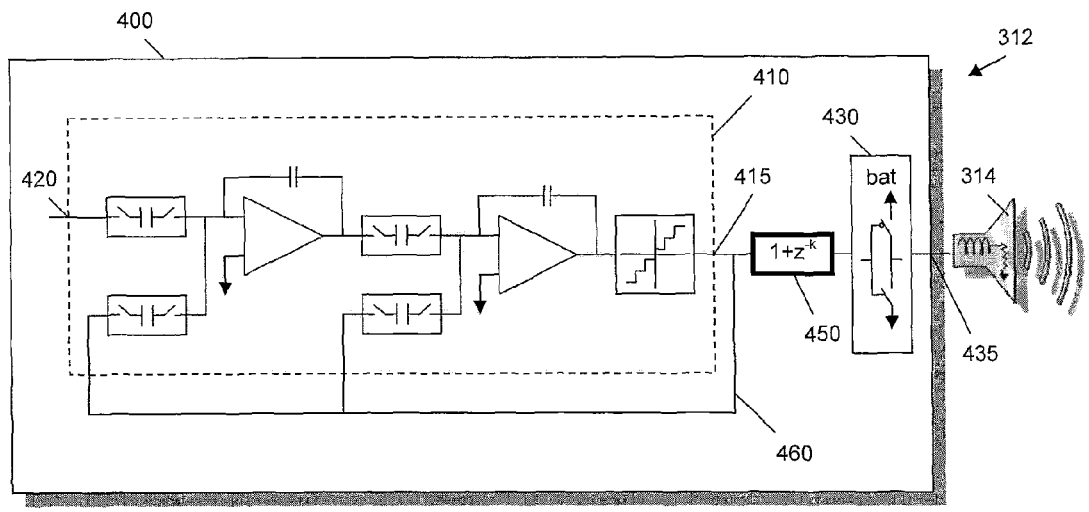
FIG. 4 illustrates an example of an integrated circuit comprising an example of amplifier circuitry.

Referring now to FIG. 4, there is illustrated an example of an integrated circuit 400 comprising an example of amplifier circuitry 312. The amplifier circuitry 312 is arranged to amplify an audio input signal 420 and comprises modulation logic 410. The modulation logic 410 is arranged to receive the audio input signal 420 and to generate a modulated signal 415 that is representative of the audio input signal 420. The amplifier circuitry 312 further comprises an output stage 430 arranged to generate an output signal 435 for the amplifier circuitry 312 based on the modulated signal 415. The amplifier circuitry 312 is arranged to be operably coupled to a load, which for the illustrated example is in the form of speaker 314.

At lower, wanted audio frequencies the impedance of speakers, such as speaker 314, is typically low. Accordingly, the majority of a power spectrum for the output of the speaker 314 at these frequencies comprises the active power (wanted audio signal). However, as will be appreciated the speaker 314 low-pass filters the received signal in the analogue domain and removes part of the quantization noise, signal image etc. Accordingly, at higher frequencies the impedance of the speaker 314 increases, and in particular at frequencies corresponding to shaped quantization noise and signal image, the impedance of the speaker 314 is significant, resulting in significant power attenuation at these higher frequencies. This higher frequency power attenuation is particularly significant for low level input signals, where the quantization noise becomes proportionately large.

Referring back to FIG. 4, the amplifier circuitry 312 further comprises a filter 450 operably coupled between the modulation logic 410 and the output stage 430. The filter 450 is arranged to substantially pass signal components within the modulated signal 415 that represent wanted audio frequencies, and to attenuate signal components within the modulated signal 415 that represent higher frequencies comprising quantization noise. For example, the filter 450 may be arranged to attenuate signal components within the modulated signal 415 that represent frequencies substantially in a region of half a switching frequency of the modulation logic 410. Thus, the filter 450 reduces the power spectral density of the output signal 435 at frequencies substantially in the region of half the switching frequency of the modulation logic 410. In this manner, quantization noise located in the region of half the switching frequency of the modulation logic 410 may be substantially reduced/filtered out by filter 450. As a result, such quantization noise is attenuated prior to the output stage 430, thereby generating the amplified output signal 435. The speaker 314 performs one further order of filtering of the amplified quantization noise, further reducing the associated power loss. This reduction in power loss, and corresponding increase in efficiency, is particularly significant for low level input signals.

For the illustrated example, the filter 450 comprises finite impulse response (FIR) filter logic, and in particular $(1+z^{-k})$ FIR filter logic, where k represents the order of the filter. However, in other examples, the filter is not limited to the use of FIR filter logic, and Infinite Impulse Response (IIR) filter logic may alternatively be used. However, FIR filter logic, such as that illustrated in FIG. 4, provides a benefit of being simple to implement using digital delays. For example, the filter 450 may comprise a digital delay component in a form of a flip-flop.

Figure 8:
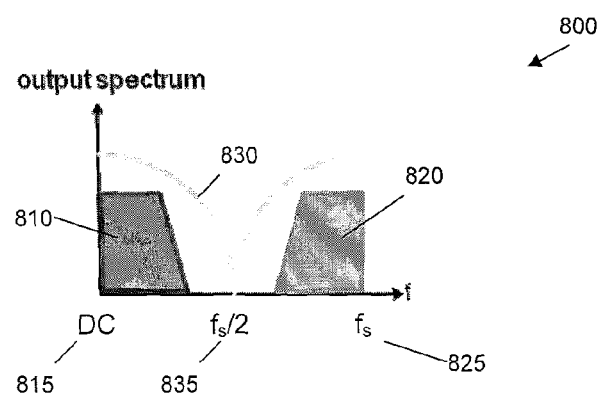
FIG. 8 illustrates a graphical example showing a power spectrum against frequency for the amplifier circuitry of FIG. 4.

Referring now to FIG. 8, there is illustrated a graphical example of the output power spectrum against frequency 800 for the amplifier circuitry 312 of FIG. 4, as well as a graphical example of a transfer function 830 for filter 450 of FIG. 4. A wanted, audio frequency component 810 of the output power spectrum is located at a lower frequency range within the power spectrum 800 of the amplifier circuitry 312, substantially adjacent zero hertz, or DC (Direct Current) 815 for the illustrated example. As will be appreciated, the modulation logic 410 of FIG. 4 is a discrete time circuit arranged to operate at a switching frequency $f_s$ 825. Thus, an image of the audio frequency component 820 is produced by the modulation logic 410 which is substantially symmetrical to the wanted audio frequency component 810 and arranged to be about half the switching frequency $(f_s/2)$ 835 (Nyquist criteria).

The filter 450 for the illustrated example is arranged to operate at the same clock speed as the modulation logic 410, namely at the switching frequency $f_s$ 825. Accordingly, the filter 450 is subject to the same symmetrical characteristics about $f_s/2$ 835. As a result, if the filter 450 were arranged to attenuate the image of the audio frequency component 820, substantially symmetrical attenuation would occur about $f_s/2$ 835, thereby causing the wanted, audio frequency component 810 to also be attenuated. However, for the illustrated example, the filter 450 is arranged to attenuate signal components within the modulated signal (415) that represents frequencies substantially in the region of half the switching frequency $(f_s/2)$ 835 of the modulation logic 410, whilst passing signal components within the modulated signal 415 that represents wanted audio frequencies 810. For the illustrated embodiment filter in FIG. 4 logic 410 comprises $(1+z^{-k})$ FIR filter logic, where k=1. Accordingly, the transfer function of the filter logic 410 comprises a single zero, and in particular comprises a single zero arranged to be substantially located at half the switching frequency $(f_s/2)$ 835. In this manner, unwanted components such as quantization noise that were present in the region of half the switching frequency $(f_s/2)$ 835 may be attenuated. In particular, such unwanted components may be attenuated out of the modulated signal 415 within the digital domain, prior to the output stage 430 generating the amplified output signal 435. Consequently, the speaker 314 performs one further order of filtering of the amplified quantization noise, further reducing the associated power loss. As will be appreciated, the $(1+z^k)$ FIR filter logic 410 may comprise a transfer function with more than one zero substantially equally distributed between zero, so long as the zeros are hertz (DC) and the switching frequency of the modulation logic 410, and in particular within the region of half the switching frequency of the modulation logic (410).

Referring back to FIG. 4, for the illustrated example, the amplifier circuitry 312 comprises a switching mode amplifier, and in particular a class-D amplifier. Such amplifiers provide the benefit of high power efficiency (low energy losses), as well as reduced size and weight due to their not requiring bulky heat sinks and the like. Furthermore, in one example, the modulation logic 410 illustrated in FIG. 4 is arranged to perform pulsed density modulation to generate the modulated signal 415, and may for example comprise Sigma-Delta modulation logic.

In accordance with a further example, the modulation logic 410 may be arranged to shape quantization noise such that the quantization noise, is substantially concentrated at frequencies in the region of half the switching frequency of the modulation logic 410. In this manner, a larger proportion of the quantization noise may be attenuated by the filter logic 450.

For the example illustrated in FIG. 4, the amplifier circuitry 312 comprises a feedback loop 460 arranged to provide feedback to the modulation logic 410. In particular, for the example illustrated in FIG. 4, the feedback loop 460 is arranged to provide feedback from the modulated signal 415 generated by the modulation logic 410, which is fed back in to the modulation logic 410, enabling the modulation logic 410 to shape the quantization noise.

However, for the example illustrated in FIG. 4, the amplifier circuitry 312 comprises no output stage feedback. As a result, when generating the modulated signal 415, the modulation logic 410 is not able to take into account, and thus not compensate for, power supply noise introduced by the output stage 430. Consequently, the amplifier circuitry 312 may be susceptible to a poor Power Supply Rejection Ratio (PSRR) from the output stage 430 as a result of a potentially noisy power supply.

Figure 5:
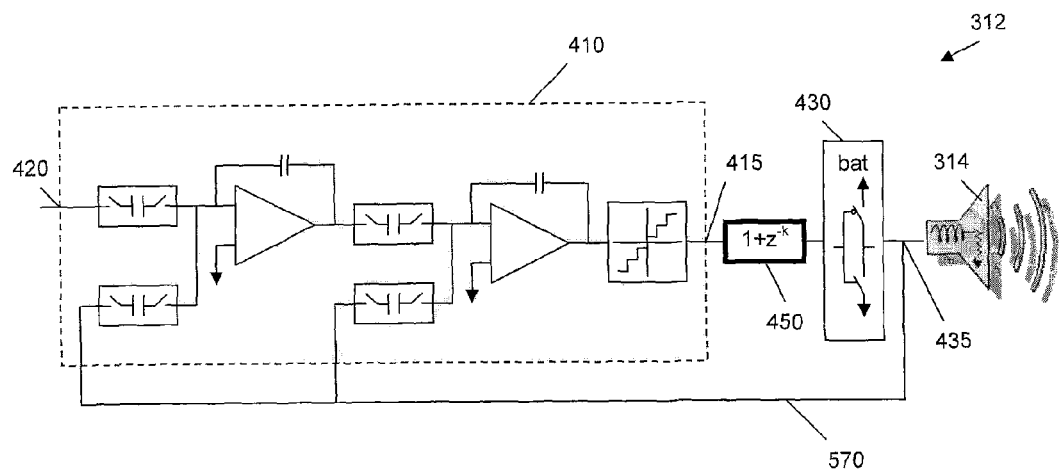
FIG. 5 illustrates an alternative example of an amplifier circuit.

Referring now to FIG. 5, there is illustrated a further alternative example of amplifier circuitry 312. As for the example of FIG. 4, the amplifier circuitry 312 of FIG. 5 comprises modulation logic 410 arranged to receive the audio input signal 420 and to generate a modulated signal 415 that is representative of the audio input signal 420. The amplifier circuitry 312 of FIG. 5 also comprises output stage 430 arranged to generate an output signal 435 for the amplifier circuitry 312 based on the modulated signal 415, and filter 450 operably coupled between the modulation 410 and the output stage 430. For the illustrated example of FIG. 5, the amplifier circuitry 312 comprises a feedback loop 570 arranged to provide feedback to the modulation logic 410 from the output signal 435 generated by the output stage 430. In this manner, the modulation logic 410 is able to take into account, and compensate for, power supply noise introduced by the output stage 430. Accordingly, the amplifier circuitry 312 of FIG. 5 is capable of a good PSSR performance.

However, the feedback loop 570 provides feedback to the modulation logic 410 from the output signal 435 generated by the output stage 430. As a result, the feedback comprises characteristics introduced by the filter 450. In particular, the feedback may comprise one or more 'zeros' within its power spectrum that have been introduced by the attenuation of the filter 450. Consequently, the modulation logic 410 may attempt to compensate for these zeros by creating additional poles within the quantization noise transfer function of the modulated signal 415. As a result, the amount of quantization noise would be increased, saturating the modulation logic 410, potentially resulting in the modulated logic 410 becoming unstable.

Figure 6:
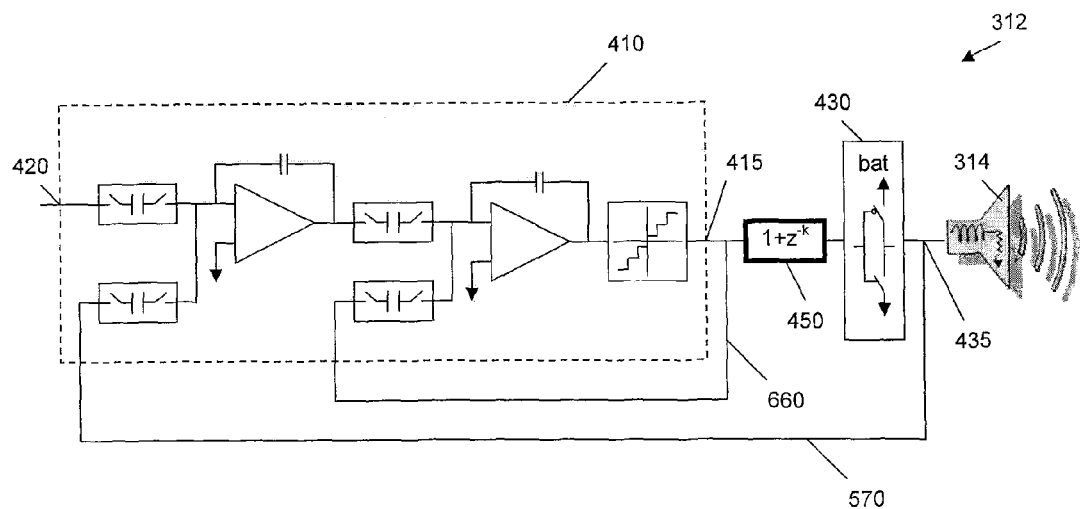
FIG. 6 illustrates further alternative example of amplifier circuit.

FIG. 6 illustrates a yet further alternative example of amplifier circuitry 312. As for the examples of FIGS. 4 and 5, the amplifier circuitry 312 of FIG. 6 comprises modulation logic 410 arranged to receive the audio input signal 420 and to generate a modulated signal 415 that is representative of the audio input signal 420. The amplifier circuitry 312 of FIG. 5 also comprises output stage 430 arranged to generate an output signal 435 for the amplifier circuitry 312 based on the modulated signal 415, and filter logic 450 operably coupled between the modulation 410 and the output stage 430. For the illustrated example of FIG. 6, the amplifier circuitry 312 comprises a first feedback loop 570 arranged to provide feedback to the modulation 410 from the output signal 435 generated by the output stage 430. In this manner, the modulation logic 410 is able to at least partially take into account, and compensate for, power supply noise introduced by the output stage 430. In addition, the amplifier circuitry 312 of FIG. 6 further comprises a second feedback loop 660 arranged to provide feedback to the modulation logic 410 from the modulated signal 415 generated thereby. In this manner, the second feedback loop 660 provides feedback to the modulation logic 410 that is substantially free of characteristics introduced by the filter 450. Thus, the effect of the attenuation of the filter 450 within the feedback provided to the modulation logic 410 is reduced, and the modulation logic 410 remains stable.

However, In order for the modulation logic 410 to perform k order shaping of noise, the noise to be shaped is required to be applied to 'k' feedback loops. For the example illustrated in FIG. 6, the feedback from the output signal 435 is only applied to one of the feedback loops. As a result, the modulation logic 410 is only able to perform first order PSRR shaping.

Figure 7:
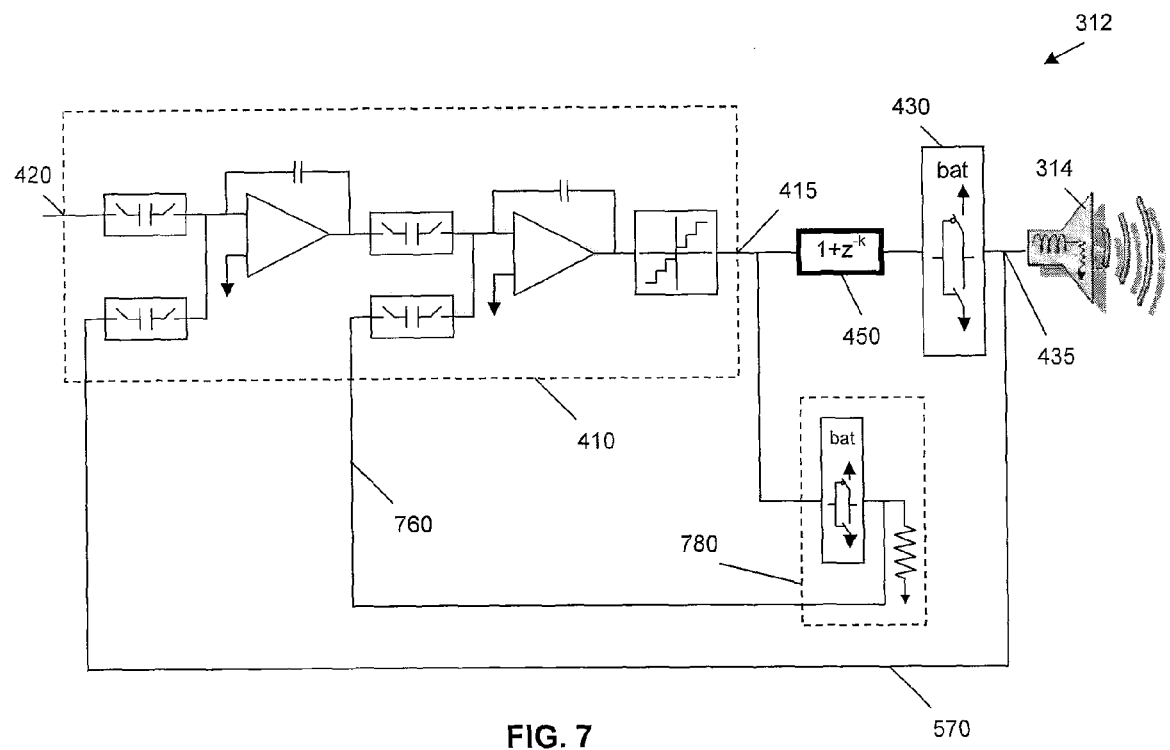
FIG. 7 illustrates a still further example of an alternative amplifier circuit.

FIG. 7 illustrates a still further alternative example of amplifier circuitry 312. Once again, the amplifier circuitry 312 comprises modulation logic 410 arranged to receive the audio input signal 420 and to generate a modulated signal 415 that is representative of the audio input signal 420. The amplifier circuitry 312 also comprises output stage 430 arranged to generate an output signal 435 for the amplifier circuitry 312 based on the modulated signal 415, and filter 450 operably coupled between the modulation logic 410 and the output stage 430. For the example illustrated in FIG. 7, the amplifier circuitry 312 comprises a first feedback loop 570 arranged to provide feedback to the modulation logic 410 from the output signal 435 generated by the output stage 430. In this manner, the modulation logic 410 is able to perform first order PSRR shaping. In addition, the amplifier circuitry 312 of FIG. 7 comprises a further feedback loop 760 arranged to provide feedback to the modulation logic 410 from the modulated signal 415 generated thereby. The further feedback loop 760 comprises power supply representation logic 780 arranged to introduce a representation of power supply noise into the further feedback loop 760. In this manner, power supply noise is applied to both feedback loops 570, 660, thereby enabling the modulation logic 410 to perform not just first order PSRR shaping but second order PSRR shaping as well. For the illustrated example, the power supply representation logic 780 comprises mock power stage and load circuitry. In particular, the mock power stage and load circuitry comprises a mock power stage 782, for example having an ON impedance substantially 'N' times higher than the output stage 430 of the amplifier circuitry 312, and a mock load 784 comprising an impedance substantially 'N' times higher than that of the load of the amplifier circuitry 312, which for the illustrated embodiment is in the form of speaker 314. The 'N' factor on the mock power stage and load allows the integration of a copy of the power stage "N" times smaller in size than the main power stage and "N" times less power consuming.

For the illustrated examples, the modulation logic 410 comprises a $2^{nd}$ order modulator. However, it is contemplated that the amplifier circuitry may comprise modulation logic 410 comprising an $i^{th}$ order modulator, where T may comprise a value other than two. Furthermore, the amplifier circuitry 312 may comprise a first feedback loop, such as feedback loop 570, arranged to provide feedback to the modulation logic 410 from the output signal 435 generated by the output stage 430, and (i−1) further feedback loops, such as feedback loop 760, arranged to provide feedback to the modulation logic 410 from the modulated signal 415 generated thereby. In particular, the (i−1) further feedback loops may comprise power supply representation logic, such as mock power stage and load circuitry 780.

The various examples hereinbefore described and illustrated in the accompanying drawings may provide at least one of the following:

(i) reduced power loss leading to improved efficiency of audio arrangements, which in turn enables improved battery life for communication units;
(ii) reduced power efficiency limitations that are typically inherent to the high frequency power spectral density of Sigma-Delta based class-D amplifiers;
(iii) modulator stability within amplifier circuitry, due to feedback loop flexibility;
(iv) maintaining good total harmonic distortion and noise (THD+N) characteristics, a good power supply rejection ratio (PSSR), and good immunity to electromagnetic interference (EMI);
(v) alleviating the need for external components, such as external LC filters, for improving the power efficiency during low level input signals;
(vi) a simple implementation based on digital delays;
(vii) power efficiency being less sensitive to load (speaker) characteristics; and
(viii) no significant impact on the die size or cost for the amplifier circuitry.

In the foregoing specification, the invention has been described with reference to specific examples. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The conductors as discussed herein may be illustrated or described in reference to being a single conductor, a plurality of conductors, unidirectional conductors, or bidirectional conductors. However, different examples may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative examples may include multiple instances of a particular operation, and the order of operations may be altered in various other examples.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An amplifier circuitry comprising a class-D amplifier for amplifying an audio input signal, the amplifier circuitry comprising:
   sigma-delta modulation logic arranged to receive the audio input signal and to generate a modulated signal that is representative of the audio input signal;
   an output stage arranged to generate an output signal based on the modulated signal;
   a finite impulse response, FIR, digital filter, operably coupled between the sigma-delta modulation logic and the output stage, and having at least one zero in its transfer function arranged to substantially pass signal components within the modulated signal occurring at frequencies less than the at least one zero and to attenuate signal components within the modulated signal at frequencies greater than the at least one zero;
   at least one feedback loop arranged to provide feedback signal to the sigma-delta modulation logic from the output signal; and
   at least one further feedback loop arranged to provide feedback to the sigma-delta modulation logic from the modulated signal generated thereby; the at least one feedback loop arranged to provide feedback from the sigma-delta modulation logic comprises power supply representation logic arranged to introduce a representation of power supply noise into the at least one feedback loop.

2. The amplifier circuitry of claim 1 wherein the frequencies less than the at least one zero that are passed represent wanted audio frequencies and frequencies greater than the at least one zero that are attenuated represent higher frequencies comprising quantization noise.

3. The amplifier circuitry of claim 1 wherein the FIR digital filter comprises FIR filter logic having a transfer function with k zeros substantially equally distributed between zero hertz and the switching frequency of the modulation logic.

4. The amplifier circuitry of claim 1 wherein the FIR digital filter is arranged to substantially pass signal components within the modulated signal that represent wanted audio frequencies, and to attenuate signal components within the modulated signal represent frequencies substantially in a region of half a switching frequency of the modulation logic.

5. The amplifier circuitry of claim 3 wherein the FIR digital filter comprises a digital delay component in a form of a flip-flop.

6. The amplifier circuitry of claim 4 wherein the sigma-delta modulation logic is further arranged to shape quantization noise such that the quantization noise is substantially concentrated at frequencies in a region of half the switching frequency of the modulation logic.

7. The amplifier circuitry of claim 1 wherein the power supply representation logic comprises mock power stage and mock load circuitry.

8. The amplifier circuitry of claim 7 wherein the mock power stage comprises a mock power stage having an 'ON' impedance substantially N times higher than the output stage of the amplifier circuitry.

9. The amplifier circuitry of claim 7 wherein the mock load circuitry comprises an impedance substantially N times higher than that of a load of the amplifier circuitry.

10. The amplifier circuitry of claim 1 wherein the sigma-delta modulation logic comprises an ith order modulator, and further feedback loops arranged to provide feedback to the sigma-delta modulation logic from the modulated signal generated thereby.

11. An integrated device comprising an amplifier circuitry having a class-D amplifier for amplifying an audio input signal, the amplifier circuitry comprising:
    sigma-delta modulation logic arranged to receive the audio input signal and to generate a modulated signal that is representative of the audio input signal; and
    an output stage arranged to generate an output signal based on the modulated signal;
    a finite impulse response, FIR, digital filter, operably coupled between the sigma-delta modulation logic and the output stage, and having at least one zero in its transfer function arranged to substantially pass signal components within the modulated signal occurring at frequencies less than the at least one zero and to attenuate signal components within the modulated signal at frequencies greater than the at least one zero;
    at least one feedback loop arranged to provide a feedback signal to the sigma-delta modulation logic from the output signal; and
    at least one further feedback loop arranged to provide feedback to the sigma-delta modulation logic from the modulated signal generated thereby; the at least one feedback loop arranged to provide feedback from the sigma-delta modulation logic comprises power supply representation logic arranged to introduce a representation of power supply noise into the at least one feedback loop.

12. A communication unit comprising the amplifier circuitry of claim 1.

13. The amplifier circuitry of claim 2 wherein the FIR digital filter is arranged to substantially pass signal components within the modulated signal that represent wanted audio frequencies, and to attenuate signal components within the modulated signal represent frequencies substantially in a region of half a switching frequency of the modulation logic.

14. The amplifier circuitry of claim 4 wherein the FIR digital filter comprises a digital delay component in a form of a flip-flop.

15. The amplifier circuitry of claim 1 wherein the sigma-delta modulation logic comprises an ith order modulator, and further feedback loops arranged to provide feedback to the sigma-delta modulation logic from the modulated signal generated thereby.

16. The amplifier circuitry of claim 5 wherein the sigma-delta modulation logic is further arranged to shape quantization noise such that the quantization noise is substantially concentrated at frequencies in a region of half the switching frequency of the modulation logic.

* * * * *